US008181133B2

(12) United States Patent
Gowda et al.

(10) Patent No.: US 8,181,133 B2
(45) Date of Patent: May 15, 2012

(54) COMBINATIONAL EQUIVALENCE CHECKING FOR THRESHOLD LOGIC CIRCUITS

(75) Inventors: Tejaswi Gowda, Tempe, AZ (US); Sarma Vrudhula, Chandler, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 402 days.

(21) Appl. No.: 12/401,982

(22) Filed: Mar. 11, 2009

(65) Prior Publication Data

US 2009/0235216 A1 Sep. 17, 2009

Related U.S. Application Data

(60) Provisional application No. 61/035,521, filed on Mar. 11, 2008.

(51) Int. Cl.
*G06F 9/455* (2006.01)
*G06F 17/50* (2006.01)

(52) U.S. Cl. ...................................... 716/107
(58) Field of Classification Search ............. 716/107
See application file for complete search history.

(56) References Cited

U.S. PATENT DOCUMENTS

| 7,835,898 B2 * | 11/2010 | Geist et al. ........... 703/15 |
| 2005/0262456 A1 * | 11/2005 | Prasad .................. 716/4 |
| 2009/0300563 A1 * | 12/2009 | Moon ................... 716/5 |

OTHER PUBLICATIONS

Gowda et al.; "Combinational Equivalence Checking for Threshold Logic Circuits"; Mar. 11, 2007; School of Computing and Informatics, Arizona State University; pp. 102-107.*

Avedillo et al., "A Threshold Logic Synthesis Tool for RTD Circuits", Euromicro Sym., 4 pages; Mar. 2004.
Beiu et al., "VLSI Implementations of Threshold Logic—A Comprehensive Survey", IEEE Transactions on Neural Networks, vol. 14, No. 5, pp. 1217-1243, Sep. 2003.
Celinski et al., "State-of-the-Art in CMOS Threshold-Logic VLSI Gate Implementations and Applications", Proceedings of SPIE vol. 5117, pp. 53-64, 2003.
Sentovich et al., "SIS: A System for Sequential Circuit Synthesis", Technical Report, Dept. of EECS, UC Berkley, CA., pp. 1-45, May 4, 1992.
Gowda et al., "Synthesis of Threshold Logic Circuits Using Tree Matching", In Proc. of ECCTD, 4 pages, Aug. 2007.
Gowda et al., "Combinational Equivalence Checking for Threshold Logic Circuits", in Proc. of ACM GLSVSLI, pp. 102-107, Mar. 11, 2007.
Gowda et al., "A Non-ILP Based Threshold Logic Synthesis Methodology", In Proc. of the IWLS, 8 pages, 2007.

(Continued)

*Primary Examiner* — Suresh Memula
(74) *Attorney, Agent, or Firm* — Withrow & Terranova, P.L.L.C.

(57) ABSTRACT

Aspects of a method and system for combinational equivalence checking for threshold logic circuits are provided. In this regard, one or more inputs may be received at a threshold logic gate. The threshold function of the threshold logic gate may be recursively decomposed into a first function and a second function using cofactors of the threshold function. A Boolean function representation of the threshold logic gate may be generated based on the recursive decomposition of the threshold function. The generated Boolean function representation of the threshold logic gate may be a maximally factored form representation of a minimal sum of products (SOP) for the threshold logic gate. A logical equivalence of the threshold logic gate may be verified with one or more other logic circuits based on the generated Boolean function representation of the threshold logic gate.

35 Claims, 11 Drawing Sheets

OTHER PUBLICATIONS

Zhang et al., "Threshold Network Synthesis and Optimization and Its Application to Nanotechnologies", IEEE Transactions on Computer-Aided Design of Integrated Circuits and Systems, vol. 24, No. 1, pp. 107-118, Jan. 2005.

Hulgaard et al., "Equivalence Checking of Combinational Circuits Using Boolean Expression Diagrams", IEEE Transactions on Computer-Aided Design of Integrated Circuits and Systems, vol. 18, No. 7, pp. 903-917, Jul. 1999.

* cited by examiner

COMBINATIONAL EQUIVALENCE CHECKING FOR THRESHOLD LOGIC CIRCUITS

CROSS-REFERENCE TO RELATED APPLICATIONS/INCORPORATION BY REFERENCE

This patent application makes reference to, claims priority to and claims benefit from U.S. Provisional Patent Application Ser. No. 61/035,521, filed on Mar. 11, 2008.

FEDERALLY SPONSORED RESEARCH OR DEVELOPMENT

This invention was made with government support under grant number 0702831/CCF0702831 awarded by NSF. The Government has certain rights in the invention.

FIELD OF THE INVENTION

Certain embodiments of the invention relate to logic circuits. More specifically, certain embodiments of the invention relate to combinational equivalence checking for threshold logic circuits.

BACKGROUND OF THE INVENTION

The field of threshold logic is gaining prominence as an alternative to Boolean logic as a result of an increase in the availability of devices that implement threshold logic circuits efficiently, for example, current mode circuits and/or differential mode circuits. One of the many advantages of threshold logic is that logic primitives may be replaced by elements of a much larger class of functions known as threshold logic gates. For instance, each of the Boolean functions $ab(c+d)+cd(a+b)$ and $a(b+c+d)+b(c+d)+cd$, may be realized by a single threshold logic gate. If a Boolean function may be realized as a network of threshold logic gates, significantly fewer nodes and a smaller network depth may be required.

There have been numerous efficient implementations of threshold logic gates in CMOS that have achieved high performance and significantly reduced area. CMOS circuits implementing Boolean logic may have higher functional yield in the presence of process variations, when compared to threshold logic circuits. A plurality of nano devices, for example, resonant tunneling diodes (RTDs), single electron transistors (SETs), quantum-dot cellular automata (QCA) cells and other nano devices have been implementing threshold logic circuits, and accordingly there is a need in the design automation community to design efficient tools for threshold logic.

The synthesis of a circuit may comprise transforming one representation of a function to another, usually to a more detailed specification. The process equivalence checking (EC) may be related to synthesis, and may entail demonstrating an equivalence of two functional representations. The function of a synthesized circuit may be verified with a given functional specification. In addition, engineering changes that may be introduced throughout a design process may introduce errors in the synthesized circuit. Demonstrating equivalence may also be required between two different representations of the same circuit generated at different phases in the design flow.

The naive way to determine the logic function of a threshold gate may be to try all $2^n$ input combinations and determine the on-set of the function, and generate a sum-of-products (SOP) representation. One of the features of threshold gates is that they permit efficient realization (both in area and delay) of gates with large fan-in. Hence the naive approach may not be practical.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for combinational equivalence checking for threshold logic circuits, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for combinational equivalence checking for threshold logic circuits. In various exemplary embodiments of the invention, one or more inputs may be received at a threshold logic gate. The one or more inputs may comprise one or more of binary inputs, weights, and/or weighted binary inputs, for example. The threshold function of the threshold logic gate may be recursively decomposed into a first function and a second function using cofactors of the threshold function. A Boolean function representation of the threshold logic gate may be generated based on the recursive decomposition of the threshold function. The generated Boolean function representation of the threshold logic gate may be a maximally factored form representation of a minimal sum of products (SOP) for the threshold logic gate. A logical equivalence of the threshold logic gate may be verified with one or more other logic circuits based on the generated Boolean function representation of the threshold logic gate.

A factored form may be maximally factored, if for every sum of products, there are no two syntactically equivalent factors in the product, and for every product of sums, there are no two syntactically equivalent factors in the sums. A SOP is a complete sum or a sum of all prime implicants and only prime implicants if and only if no term includes any other term, and the consensus of any two terms of the SOP either does not exist or is contained in some other term. The complete sum of a function F may be denoted by CS(F). For example, the complete sum of the function [ab+ab+c] is a+c.

An exact factored form of an SOP may be a factored form which when expanded by repeated algebraic multiplication only without absorbing terms, may result in the original SOP. For example, if the SOP of F=ab+bc+ca, the factored form, a(b+c+bc)+bc, is not an exact factored form even though F≡a(b+c+bc)+bc. The factored form, a(b+c)+bc, is an exact factored form of F, for example.

The iterated consensus is a method based on the consensus theorem that generates the complete sum of a function using any SOP. The iterated consensus method may add to the SOP, all the consensus terms of all pairs of cubes in the SOP. The iterated consensus method may then remove the terms that are present in other terms. This method may be repeated until no further consensus is possible. For example, if the SOP of $F=x_1x_2+x_2x_3+x_2x_3x_4$, the iterated consensus of $F=x_1x_2+x_2x_3+x_1x_3+x_3x_4$, or the complete sum of F, (CS(F)).

Figure 1A:
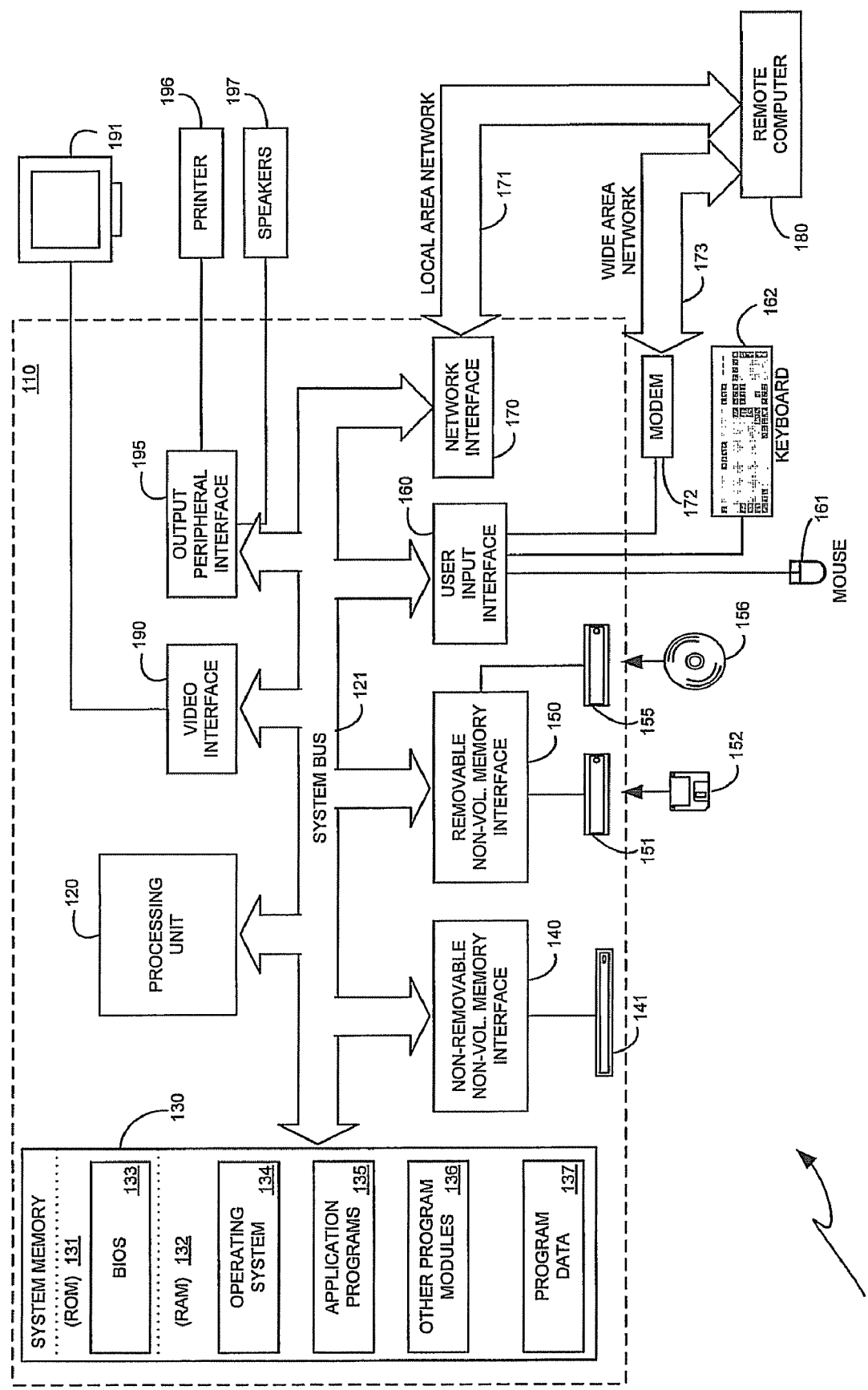
FIG. 1A illustrates an example of a suitable computing system environment 10 using which a method for combinational equivalence checking for threshold logic circuits may be implemented, in accordance with an embodiment of the invention.

FIG. 1A illustrates an example of a suitable computing system environment 10 using which a method for combinational equivalence checking for threshold logic circuits may be implemented, in accordance with an embodiment of the invention. The computing system environment 10 is an example of a suitable computing environment and is not intended to suggest any limitation as to the scope of use or functionality of the invention. Neither should the computing system environment 10 be interpreted as having any dependency or requirement relating to any one or combination of components illustrated in the exemplary computing system environment 10.

The exemplary computing system environment 10 may be operational with numerous other general purpose or special purpose computing system environments or configurations, for example, personal computers, server computers, handheld or laptop devices, multiprocessor systems, microprocessor-based systems, set top boxes, programmable consumer electronics, network PCs, minicomputers, mainframe computers, networked peripherals, networked printers, and/or distributed computing environments that may comprise any of the above systems and/or devices.

The exemplary computing system environment 10 may be described in the general context of computer-executable instructions, such as program modules, being executed by a computer. Generally, program modules may include routines, programs, objects, components, and/or data structures that may perform particular tasks or implement particular abstract data types. The exemplary method for combinational equivalence checking for threshold logic circuits may also be implemented in distributed computing environments where tasks may be performed by remote processing devices that may be linked through a communications network. In a distributed computing environment, program modules may be located in both local and remote computer storage media including memory storage devices.

With reference to FIG. 1A, an exemplary system for implementing the method for combinational equivalence checking for threshold logic circuits may comprise a general purpose computing device in the form of a computer system 110. Notwithstanding, the computer system 110 may be referred to as a computer 110, without limiting the scope of the invention. The components of the computer system 110 may comprise, but are not limited to, a processing unit 120, a system memory 130, and a system bus 121 that may couple various system components including the system memory 130 to the processing unit 120. The system bus 121 may be any of several types of bus structures including a memory bus or a memory controller, a peripheral bus, a cross-bar, a switched bus fabric, and a local bus using any of a variety of bus architectures.

The computer system 110 may comprise a variety of computer readable media, for example. The computer readable media may be any available media that may be accessed by the computer 110 and may comprise volatile and/or nonvolatile media, removable and/or non-removable media. For example, computer readable media may comprise computer storage media and/or communication media. The computer storage media may be implemented in any method or technology for storage of information such as computer readable instructions, data structures, program modules and/or other data. The computer storage media may comprise, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store desired information and which may be accessed by the computer system 110. For example, the communication media may comprise wired media such as a wired network or a direct-wired connection, and/or wireless media such as acoustic, RF, infrared and other wireless media.

The system memory 130 may comprise computer storage media in the form of volatile and/or nonvolatile memory such as read only memory (ROM) 131 and random access memory (RAM) 132. A basic input/output system 133 (BIOS), comprising basic routines that may enable transfer of information between elements within the computer system 110, such as during start-up, may be stored in the ROM 131. The RAM 132 may comprise data and/or program modules that may be immediately accessible to and/or presently being operated on by the processing unit 120. The system memory 130 may also comprise an operating system 134, application programs 135, other program modules 136, and/or program data 137.

The computer system 110 may also comprise other removable/non-removable, volatile/nonvolatile computer storage media. For example, a hard disk drive 141 may be operable to read from and/or write to non-removable, nonvolatile magnetic media. A magnetic disk drive 151 may be operable to read from and/or write to a removable, nonvolatile magnetic disk 152. An optical disk drive 155 may be operable to read from and/or write to a removable, nonvolatile optical disk 156 such as a CD ROM and/or other optical media. Other removable/non-removable, volatile/nonvolatile computer storage media may be used in the exemplary operating environment, such as, magnetic tape cassettes, flash memory cards, digital versatile disks, digital video tape, solid state RAM, and/or solid state ROM. The hard disk drive 141 may be coupled to the system bus 121 via a non-removable memory interface such as interface 140, for example. The magnetic disk drive 151 and optical disk drive 155 may be coupled to the system bus 121 via a removable memory interface 150, for example.

The drives and their associated computer storage media discussed above and illustrated in FIG. 1A, may provide storage of computer readable instructions, data structures, program modules and/or other data for the computer system 110. In FIG. 1A, for example, the hard disk drive 141 may be operable to store the operating system 134, application programs 135, other program modules 136, and program data 137.

A user may enter commands and information into the computer system 110 via input devices such as a keyboard 162 and pointing device 161, for example, a mouse, trackball or touch pad, for example. Other input devices (not shown) may include a microphone, joystick, game pad, satellite dish, scanner, and/or a video input. These and other input devices may be coupled to the processing unit 120 through a user input interface 160 that may be coupled to the system bus, but may be connected by other interface and bus structures, such as a parallel port, game port or a universal serial bus (USB), for example. A monitor 191 or other type of display device may also be connected to the system bus 121 via an interface, such as a video interface 190. In addition to the monitor, other peripheral output devices may be coupled to the computer system 110, such as speakers 197, printer 196, and a video output, which may be connected through an output peripheral interface 195.

The computer system 110 may operate in a networked environment using logical connections to one or more remote computers, such as a remote computer system 180. The remote computer system 180 may be another personal computer, a server, a router, a network peripheral device, for example, a printer, a network PC, a peer device or other common network node, and may comprise many or all of the elements described above relative to the computer system 110. The logical connections depicted in FIG. 1A may comprise a local area network (LAN) 171 and a wide area network (WAN) 173, but may also include other networks.

When used in a LAN networking environment, the computer system 110 may be connected to the LAN 171 via a network interface or adapter, for example, a network interface card (NIC) 170. When used in a WAN networking environment, the computer system 110 may comprise a modem 172 or other means for establishing communications over the WAN 173, such as the Internet. The modem 172, which may be internal or external, may be connected to the system bus 121 via the user input interface 160, or other appropriate mechanism.

In accordance with an embodiment of the invention, a method for combinational equivalence checking for threshold logic circuits may be described with reference to acts and symbolic representations of operations that may be performed by one or more computer systems 110 or by one or more circuits in a computer 110, unless indicated otherwise. As such, it may be understood that such acts and operations, which may be at times referred to as being computer-executed, include the manipulation by the processing unit 120 of the computer system 110 of electrical signals representing data in a structured form. This manipulation may transform the data or maintain it at locations in the system memory 130 of the computer system 110, which may reconfigure or otherwise alter the operation of the computer system 110 in a manner well understood by those skilled in the art. The data structures where data is maintained may be physical locations of the memory that may have particular properties defined by the format of the data. However, while the invention is being described in the foregoing context, it may not be so limited, and the operation described hereinafter may also be implemented in hardware.

In accordance with an exemplary embodiment of the invention, the computer system 110 may be operable to verify a logical equivalence of a plurality of circuits. The computer system 110 may comprise a plurality of logic circuits, for example, one or more threshold logic circuits. The computer system 110 may comprise one or more circuits, for example, the processing unit 120, that is operable to receive one or more inputs at the threshold logic gate implementing a threshold function. The threshold function of the threshold logic gate may be recursively decomposed into a first function and a second function using cofactors of the threshold function. The one or more circuits in the computer system 110 may be operable to generate a Boolean function representation of the threshold logic gate based on the recursive decomposition of the threshold function. The generated Boolean function representation of the threshold logic gate may be a maximally factored form representation of a minimal sum of products (SOP) for the threshold logic gate. The one or more circuits in the computer system 110 may be operable to verify a logical equivalence of the threshold logic gate with one or more other logic circuits based on the generated Boolean function representation of the threshold logic gate.

Figure 1B:
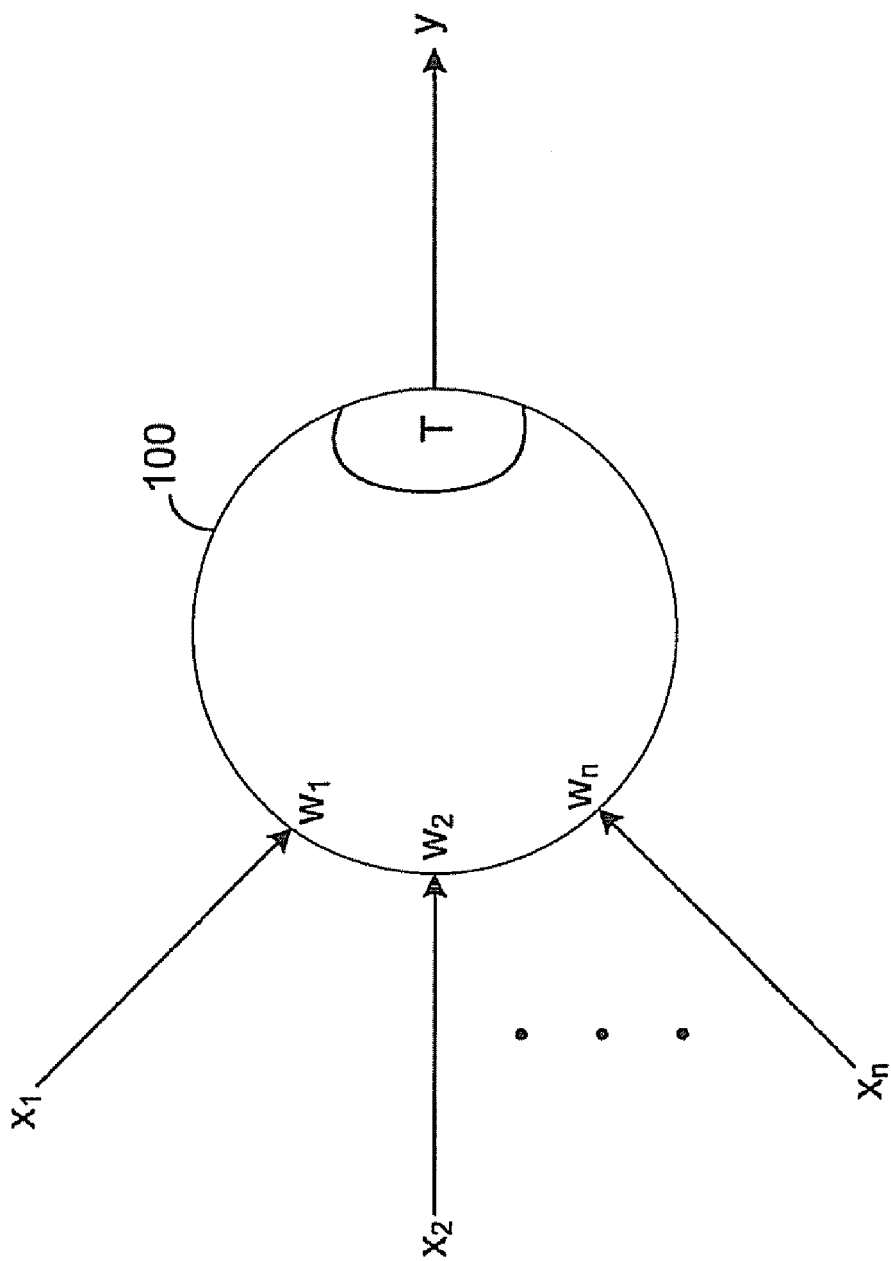
FIG. 1B is a diagram illustrating an exemplary threshold logic circuit, in accordance with an embodiment of the invention.

FIG. 1B is a diagram illustrating an exemplary threshold logic circuit, in accordance with an embodiment of the invention. Referring to FIG. 1B, there is shown a threshold logic circuit 100. The threshold logic circuit 100 may comprise suitable logic and/or circuitry to implement a threshold function F=[W;T], where W is a set of input weights, W=($w_1$, $w_2$, ..., $w_n$), T is a threshold value of the threshold logic gate 100 and X is a set of n binary inputs to the threshold logic gate 100, X={$x_1$, $x_2$, ..., $x_n$}. Each weight $w_i$ may be associated with a corresponding binary input $x_i$. The threshold value T and the weights $w_i$ (i=1, 2, ..., n) may be a real, finite, positive or negative number.

The threshold logic gate 100 may comprise one or more of current mode circuits, differential mode circuits, capacitors, complementary metal oxide semiconductor (CMOS) circuits, n-type metal oxide semiconductor (nMOS) circuits, combinational logic circuits, counters, switches, latches, registers, clocks, buffers, multiplexers, demultiplexers and/or integrated circuits. Notwithstanding, the invention may not be so limited and other digital circuits may be utilized in the threshold logic gate 100 to implement the threshold logic function F, without limiting the scope of the invention.

The output y of the threshold gate 100 may be generated according to the following equation:

$$y = \begin{cases} 1 & \text{if } \sum_{i=0}^{n} w_i x_i \geq T \\ 0 & \text{otherwise} \end{cases} \quad (1)$$

Figure 1C:
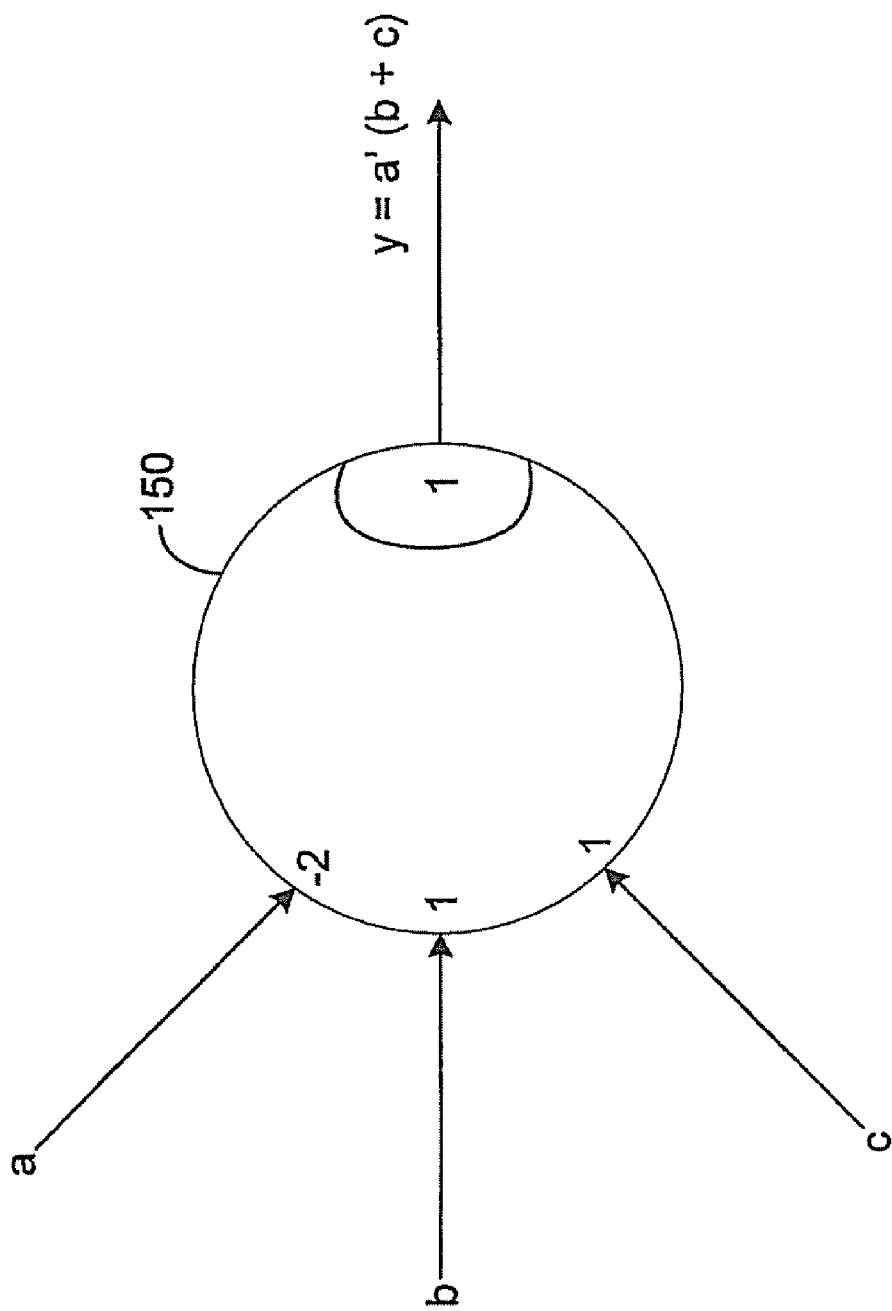
FIG. 1C is a diagram illustrating another exemplary threshold logic circuit, in accordance with an embodiment of the invention.

FIG. 1C is a diagram illustrating another exemplary threshold logic circuit, in accordance with an embodiment of the invention. Referring to FIG. 1C, there is shown a threshold logic circuit 150. The threshold logic circuit 150 may comprise suitable logic and/or circuitry to implement a threshold function F=[W;T], where W is a set of input weights, W=(−2, 1, 1), T=1 is a threshold value of the threshold logic gate 150, and X is a set of 3 binary inputs to the threshold logic gate 150, X={a, b, c}. The output y of the threshold logic gate 150 may be generated according to the following equation:

$$y = \begin{cases} 1 & \text{if } -2a+b+c \geq 1 \\ 0 & \text{otherwise} \end{cases} \quad (2)$$

If a=1, then no combination of b and c may satisfy the inequality in equation (2). If a=0, then either b=1 or c=1 may satisfy the inequality in equation (2). Accordingly, the logic function representation of the threshold logic gate 150 may be equivalent to y=a'(b+c). Notwithstanding, the invention may not be so limited and the threshold logic gate 150 may be operable to receive any number of inputs, without limiting the scope of the invention.

Figure 1D:
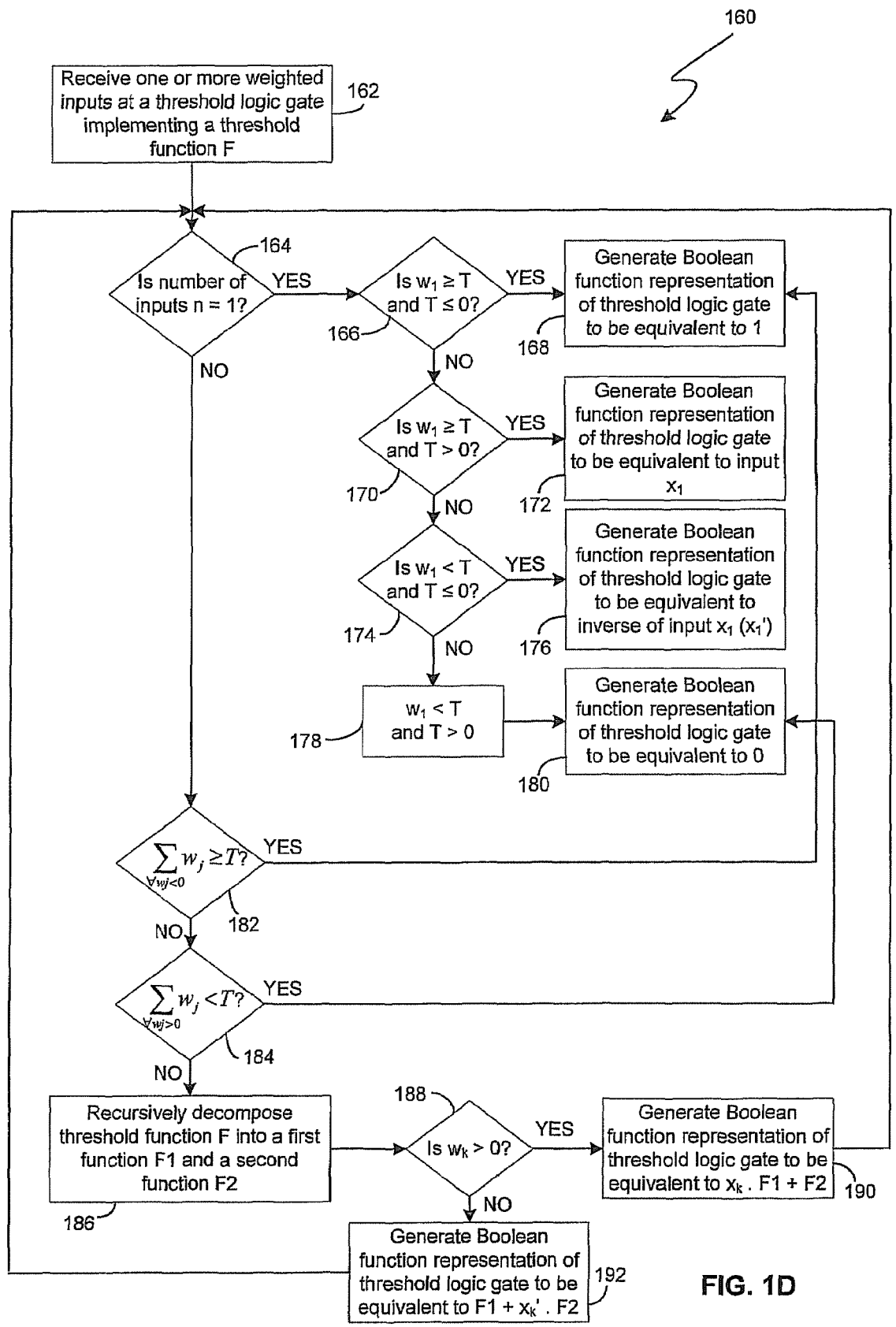
FIG. 1D is a flowchart illustrating exemplary steps for generating a Boolean function representation of a threshold logic gate, in accordance with an embodiment of the invention.

FIG. 1D is a flowchart illustrating exemplary steps for generating a Boolean function representation of a threshold logic gate, in accordance with an embodiment of the invention. Referring to FIG. 1D, there is shown a method 160 comprising a plurality of exemplary steps. In step 162, one or more inputs, for example, weighted binary inputs ($w_1x_1$, $w_2x_2$, ..., $w_nx_n$) may be received at the threshold logic gate 100. The threshold logic gate 100 may be implemented based on a threshold function F=[W;T], where W is a set of input weights, W=($w_1, w_2, ..., w_n$), X is a set of n binary inputs to the threshold logic gate 100, X={$x_1, x_2, ..., x_n$}, and T is a threshold value of the threshold logic gate 100.

In step 164, it may be determined whether the number of binary inputs n to the threshold logic gate 100 is equal to one (1). If the number of binary inputs n to the threshold logic gate 100 is equal to one (1), the threshold logic gate 100 may comprise one binary input $x_1$ with a corresponding weight $w_1$, and control passes to step 166.

In step 166, it may be determined whether the weight $w_1$ is greater than or equal to the threshold value T and the threshold value T is lesser than or equal to zero (0). If the weight $w_1$ is greater than or equal to the threshold value T and the threshold value T is lesser than or equal to zero (0), control passes to step 168. In step 168, the Boolean function representation of the threshold logic gate 100 may be generated to be equivalent to one (1). If the weight $w_1$ is not greater than or equal to the threshold value T or the threshold value T is not lesser than or equal to zero (0), control passes to step 170.

In step 170, it may be determined whether the weight $w_1$ is greater than or equal to the threshold value T and the threshold value T is greater than zero (0). If the weight $w_1$ is greater than or equal to the threshold value T and the threshold value T is greater than zero (0), control passes to step 172. In step 172, the Boolean function representation of the threshold logic gate 100 may be generated to be equivalent to the binary input $x_1$. If the weight $w_1$ is not greater than or equal to the threshold value T or the threshold value T is not greater than zero (0), control passes to step 174.

In step 174, it may be determined whether the weight $w_1$ is lesser than the threshold value T and the threshold value T is lesser than or equal to zero (0). If the weight $w_1$ is lesser than the threshold value T and the threshold value T is lesser than or equal to zero (0), control passes to step 176. In step 176, the Boolean function representation of the threshold logic gate 100 may be generated to be equivalent to an inverse of the binary input $x_1$ ($x_1$'). If the weight $w_1$ is not lesser than the threshold value T or the threshold value T is not lesser than or equal to zero (0), control passes to step 178. In step 178, the weight $w_1$ is lesser than the threshold value T and the threshold value T is greater than zero (0). In step 180, the Boolean function representation of the threshold logic gate 100 may be generated to be equivalent to zero (0).

In step 164, if the number of binary inputs n to the threshold logic gate 100 is more than one (1), control passes to step 182. In step 182, it may be determined whether a sum of negative weights is greater than or equal to the threshold value T according to equation (3):

$$\sum_{\forall w_j < 0} w_j \geq T \quad (3)$$

If the sum of negative weights is greater than or equal to the threshold value T, control passes to step 168. If the sum of negative weights is not greater than or equal to the threshold value T, control passes to step 184. In step 184, it may be determined whether a sum of positive weights is lesser than the threshold value T according to equation (4):

$$\sum_{\forall w_j > 0} w_j < T \quad (4)$$

If the sum of positive weights is lesser than the threshold value T, control passes to step 180. If the sum of positive weights is not lesser than the threshold value T, control passes to step 186.

In step 186, the threshold function F may be recursively decomposed into a first function $F_1$ and a second function $F_2$ using cofactors of the threshold function F. The first function $F_1$ may be generated, for example, by recursively decomposing the threshold function F into [W\$w_k$; T−$w_k$], where $w_k$ is a largest absolute weight and W\$w_k$=($w_1, w_2, ..., w_{k-1}, w_{k+1}, ..., w_n$) is a set of weights excluding $w_k$. The second function $F_2$ may be generated, for example, by recursively decomposing the threshold function F into [W\$w_k$; T], where $w_k$ is a largest absolute weight and W\$w_k$=($w_1, w_2, ..., w_{k-1}, w_{k+1}, ..., w_n$) is a set of weights excluding $w_k$.

In step 188, it may be determined whether the largest absolute weight $w_k$ is greater than zero (0). If the largest absolute weight $w_k$ is greater than zero (0), control passes to step 190. In step 190, the Boolean function representation of the threshold logic gate 100 may be generated to be equivalent to [$x_k \cdot F_1 + F_2$], where $x_k$ is the binary input to the threshold logic gate 100 corresponding to the largest absolute weight $w_k$. Control then returns to step 164. If the largest absolute weight $w_k$ is not greater than zero (0), control passes to step 192. In step 192, the Boolean function representation of the threshold logic gate 100 may be generated to be equivalent to [$F_1 + x_k' \cdot F_2$], where $x_k'$ is the inverse of the binary input $x_k$ to the threshold logic gate 100 corresponding to the largest absolute weight $w_k$. Control then returns to step 164.

For example, the threshold function of the threshold logic gate 100, F (a, b, c)=[2, 1, −1; 2], where the weights, $w_a$=2, $w_b$=1, $w_c$=−1 and the threshold value T=2. The one or more circuits in the computer system 110 may be operable to recursively decompose the threshold function F into a first function $F_1$ and a second function $F_2$ using cofactors of the threshold function F.

$$F = [2, 1, -1, 2] = a \cdot F_1 + F_2, \text{ where } F_1 = [1, -1; 0] \text{ and } F_2 = [1, -1; 2]$$

$$= a\{b[-1; -1] + [-1; 0]\} + 0 = a\{b(1) + c'\}$$

$$= a(b + c')$$

Each of the functions $F_1$ and $F_2$ may be further recursively decomposed into another first function $F_{11}$ and another second function $F_{12}$ using cofactors of the previously generated functions $F_1$ and $F_2$ respectively. Accordingly, the function $F_1 = [1, -1; 0]$ may be recursively decomposed into $b \cdot F_{11} + F_{12}$, where $F_{11} = [-1; -1]$ and $F_{12} = [-1; 0]$ and the function $F_2 = [1, -1; 2]$ may be recursively decomposed into zero (0). Furthermore, the one or more circuits in the computer system 110 may be operable to generate the Boolean function representation of the threshold logic function $F_{11} = [-1; -1]$ to be equivalent to one (1), since the weight −1 is greater than or equal to the threshold value −1 and the threshold value −1 is lesser than or equal to zero (0). The one or more circuits in the computer system 110 may be operable to generate the Boolean function representation of the threshold logic function $F_{12} = [-1; 0]$ to be equivalent to an inverse of the binary input c (c'), since the weight −1 is lesser than the threshold value zero (0) and the threshold value zero (0) is equal to zero (0). Accordingly, the one or more circuits in the computer system 110 may be operable to generate a Boolean function representation of the threshold logic gate 100 based on the recursive decomposition of the threshold function F to be equivalent to a(b+c'). The generated Boolean function representation of the threshold logic gate 100 is a maximally factored form representation of a minimal sum of products (SOP) for the threshold logic gate 100.

Figure 2A:
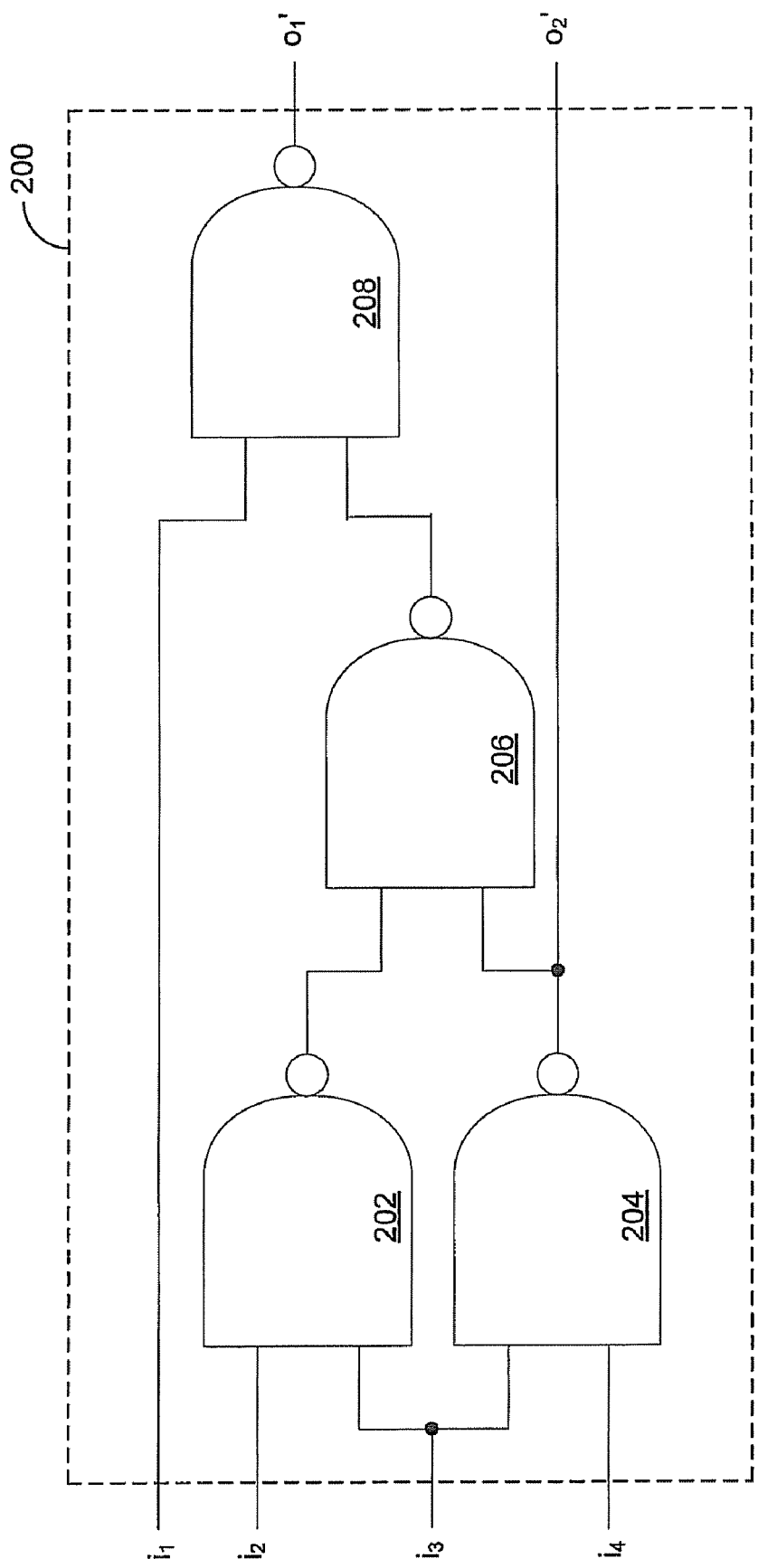
FIG. 2A is a diagram illustrating an exemplary logic circuit that may be utilized in connection with an embodiment of the invention.

FIG. 2A is a diagram illustrating an exemplary logic circuit that may be utilized in connection with an embodiment of the invention. Referring to FIG. 2A, there is shown a logic circuit 200. The logic circuit 200 may comprise a plurality of NAND gates 202, 204, 206 and 208. The logic circuit 200 may receive as binary inputs, $i_1$, $i_2$, $i_3$ and $i_4$, and generate as outputs, $o_1'$ and $o_2'$.

The NAND gate 202 may comprise suitable logic and/or circuitry to receive binary inputs $i_2$ and $i_3$, and generate an output to the NAND gate 206. The NAND gate 204 may comprise suitable logic and/or circuitry to receive binary inputs $i_3$ and $i_4$, and generate an output $o_2'$ to the NAND gate 206. The NAND gate 206 may comprise suitable logic and/or circuitry to receive as binary inputs, the outputs of NAND gates 202 and 204, and generate an output to NAND gate 208. The NAND gate 208 may comprise suitable logic and/or circuitry to receive as binary inputs, $i_1$ and an output of NAND gate 206, and generate an output $o_1'$.

Table 1 illustrates a set of generated outputs of a two input NAND gate, for example, 202, 204, 206, and 208 for a corresponding set of binary inputs.

TABLE 1

| INPUT | | OUTPUT |
|---|---|---|
| A | B | A NAND B |
| 0 | 0 | 1 |
| 0 | 1 | 1 |
| 1 | 0 | 1 |
| 1 | 1 | 0 |

Figure 2B:
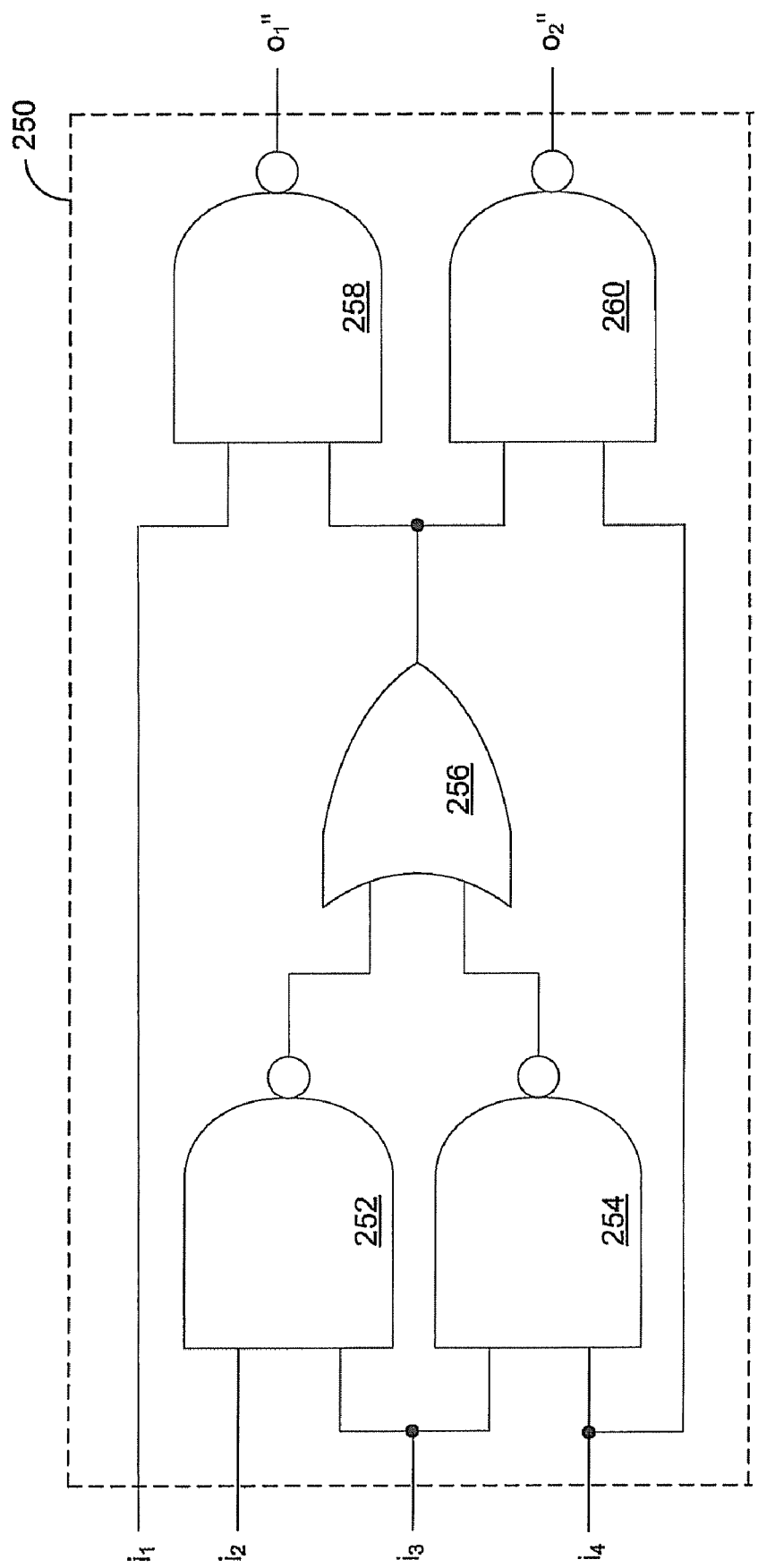
FIG. 2B is a diagram illustrating another exemplary logic circuit that may be utilized in connection with an embodiment of the invention.

FIG. 2B is a diagram illustrating another exemplary logic circuit that may be utilized in connection with an embodiment of the invention. Referring to FIG. 2B, there is shown a logic circuit 250. The logic circuit 250 may comprise a plurality of NAND gates 252, 254, 258 and 260, and an OR gate 256. The logic circuit 250 may receive as binary inputs, $i_1$, $i_2$, $i_3$ and $i_4$, and generate as outputs, $o_1''$ and $o_2''$.

The NAND gate 252 may comprise suitable logic and/or circuitry to receive binary inputs $i_2$ and $i_3$, and generate an output to the OR gate 256. The NAND gate 254 may comprise suitable logic and/or circuitry to receive binary inputs $i_3$ and $i_4$, and generate an output to the OR gate 256. The OR gate 256 may comprise suitable logic and/or circuitry to receive as binary inputs, the outputs of NAND gates 252 and 254, and generate an output to NAND gates 258 and 260. The NAND gate 258 may comprise suitable logic and/or circuitry to receive as binary inputs, $i_1$ and the output of the OR gate 256, and generate an output, $o_1''$. The NAND gate 260 may comprise suitable logic and/or circuitry to receive as binary inputs, $i_4$ and an output of the OR gate 256, and generate an output, $o_2''$. Each of the NAND gates 252, 254, 258, and 260 may be operable according to Table 1.

Table 2 illustrates a set of generated outputs of a two input OR gate, for example, 256 for a corresponding set of binary inputs.

TABLE 2

| INPUT | | OUTPUT |
|---|---|---|
| A | B | A OR B |
| 0 | 0 | 0 |
| 0 | 1 | 1 |
| 1 | 0 | 1 |
| 1 | 1 | 1 |

Figure 3A:
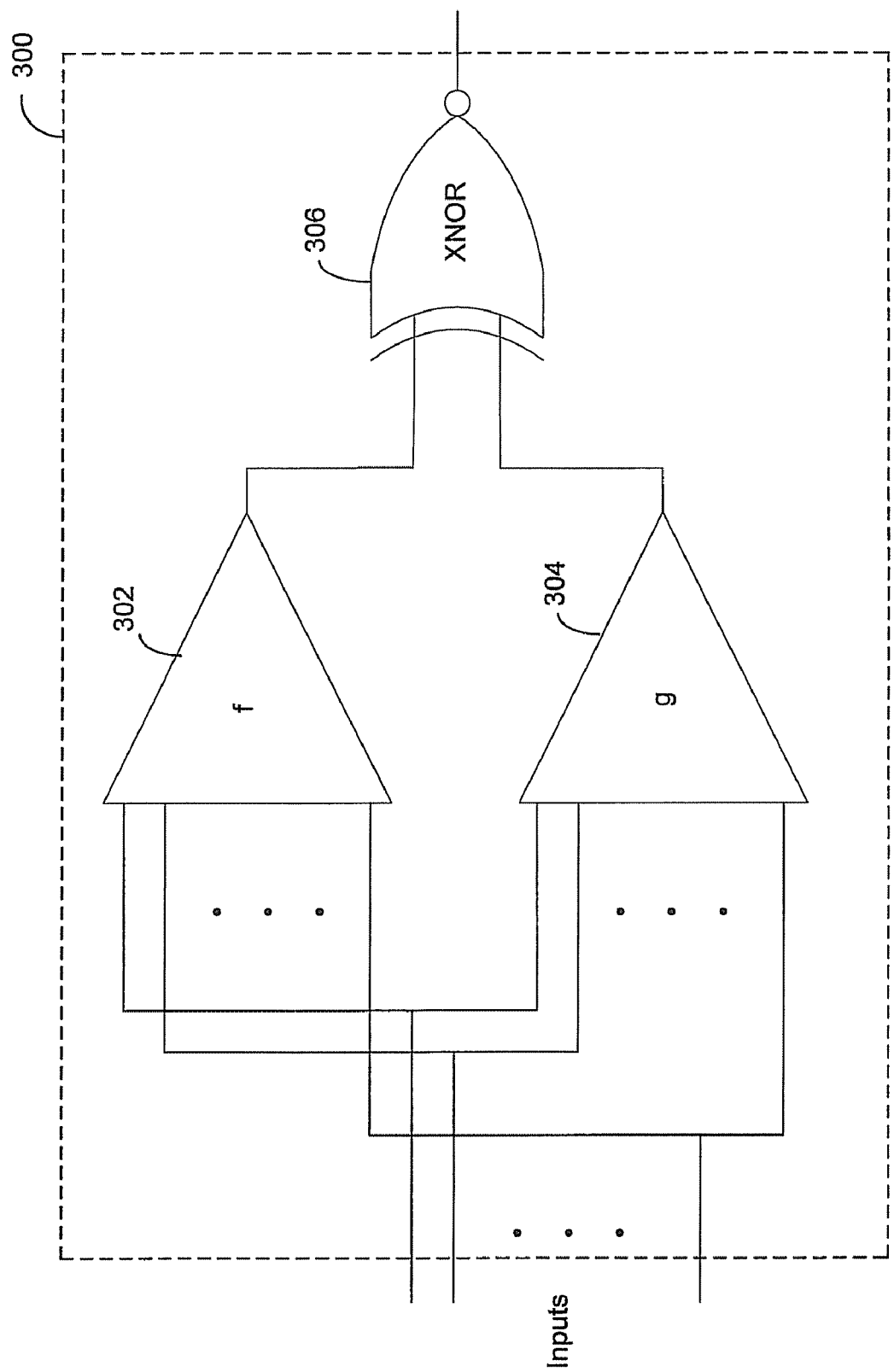
FIG. 3A is a diagram illustrating an exemplary miter circuit that may be utilized to verify a logical equivalence of a plurality of circuits, in accordance with an embodiment of the invention.

FIG. 3A is a diagram illustrating an exemplary miter circuit that may be utilized to verify a logical equivalence of a plurality of circuits, in accordance with an embodiment of the invention. Referring to FIG. 3A, there is shown a miter circuit 300. The miter circuit may comprise logic circuits f 302 and g 304, and a XNOR gate 306.

The miter circuit 300 may comprise suitable logic and/or circuitry to verify an equivalence of a plurality of logic circuits. For example, in one embodiment, the logic circuit f 302 may be a threshold logic gate 100 and g 304 may be another logic circuit, for example, one of a threshold logic circuit, a Boolean representation of a threshold logic gate, a Boolean function, and/or a combinational circuit. Notwithstanding, the invention may not be so limited, and other logic circuits may be utilized without limiting the scope of the invention. Each of the logic circuits f 302 and g 304 may comprise suitable logic and/or circuitry to be enabled to receive a plurality of binary inputs and generate an output to the XNOR gate 306. The XNOR gate 306 may comprise suitable logic and/or circuitry to receive as binary inputs, the outputs of logic circuits, f 302 and g 304, and generate an output according to Table 3.

Table 3 illustrates a set of generated outputs of a two input XNOR gate, for example, 306 for a corresponding set of binary inputs.

TABLE 3

| INPUT | | OUTPUT |
|---|---|---|
| A | B | A XNOR B |
| 0 | 0 | 1 |
| 0 | 1 | 0 |

TABLE 3-continued

| INPUT | | OUTPUT |
|---|---|---|
| A | B | A XNOR B |
| 1 | 0 | 0 |
| 1 | 1 | 1 |

Notwithstanding, the invention may not be so limited, and other logic circuits may be utilized to implement the miter circuit 300, without limiting the scope of the invention. Accordingly, the miter circuit 300 may generate an output equivalent to one (1), if the logic circuit f 302 is equivalent to the logic circuit g 304. Furthermore, the miter circuit 300 generates an output equivalent to zero (0), if the logic circuit f 302 is not equivalent to the logic circuit g 304.

In accordance with an embodiment of the invention, the miter circuit 300 may be constructed, wherein the logic circuit f 302 may receive as binary inputs $i_1$, $i_2$, $i_3$ and $i_4$, and generate as an output, $o_1'$. Similarly, the logic circuit g 304 may receive as binary inputs $i_1$, $i_2$, $i_3$ and $i_4$, and generate as an output, $o_1''$. The miter circuit 300 may be operable to verify a logical equivalence of the logic circuits f 302 and g 304, and generate an output equivalent to one (1), if the logic circuit f 302 is equivalent to the logic circuit g 304.

In accordance with another embodiment of the invention, the miter circuit 300 may be constructed, wherein the logic circuit f 302 may receive as binary inputs $i_1$, $i_2$, $i_3$ and $i_4$, and generate as an output, $o_2'$. Similarly, the logic circuit g 304 may receive as binary inputs $i_1$, $i_2$, $i_3$ and $i_4$, and generate as an output, $o_2''$. The miter circuit 300 may be operable to verify a logical equivalence of the logic circuits f 302 and g 304, and generate an output equivalent to one (1), if the logic circuit f 302 is equivalent to the logic circuit g 304.

Figure 3B:
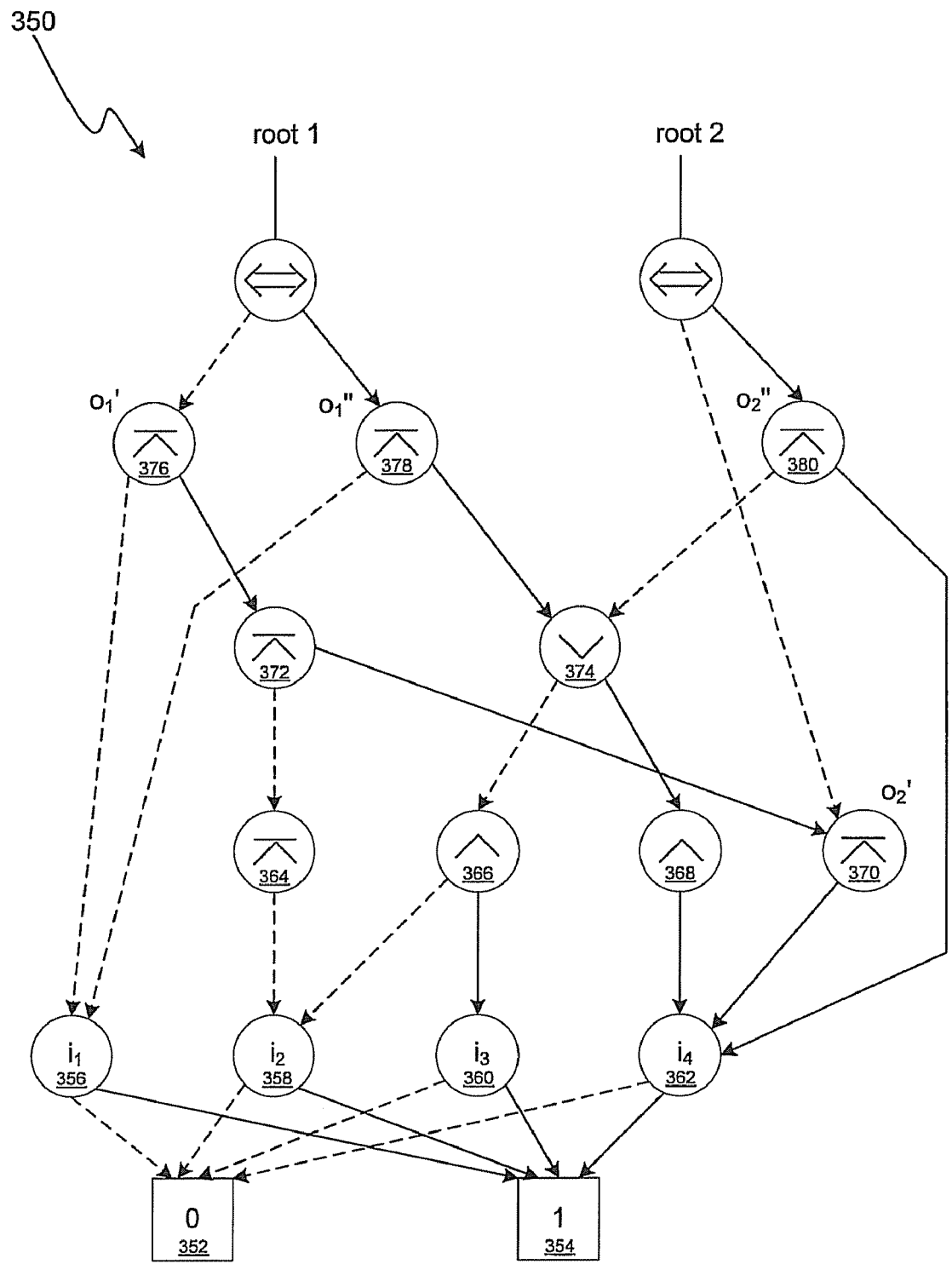
FIG. 3B is an exemplary Boolean Expression Diagram of a miter circuit, in accordance with an embodiment of the invention.

FIG. 3B is an exemplary Boolean Expression Diagram of a miter of two logic circuits, in accordance with an embodiment of the invention. Referring to FIG. 3B, there is shown a Boolean Expression Diagram 350. The one or more circuits in the computer system 110 may be operable to generate the Boolean Expression Diagram 350 based on the miter circuit of the logic circuits 200 and 250, for example.

The Boolean Expression Diagram 350 is a data structure that may be generated by extending the reduced ordered binary decision diagram (OBDD) representation with operator vertices. The Boolean Expression Diagram 350 may be similar to a logic graph representation of a Boolean circuit, for example, wherein each logic gate may be replaced by an equivalent operator node and each binary input may be replaced by a corresponding variable node. The variable nodes may be connected to the two terminal nodes (0 and 1). For example, with reference to FIG. 3B, each logic gate in FIG. 2A and FIG. 2B and the miter circuit 300 may be replaced by an equivalent operator node, for example, operator nodes 364, 366, 368, 370, 372, 374, 376, 378 and 380, and each binary input ($i_1$, $i_2$, $i_3$ and $i_4$) may be replaced by a corresponding variable node 356, 358, 360, and 362 respectively. The variable nodes 356, 358, 360, and 362 may be connected to the two terminal nodes 352 (0) and 354 (1) respectively. The outputs ($o_1'$, $o_1''$, $o_2'$ and $o_2''$) may be represented by the binary inputs to the variable nodes 376, 378, 370 and 380 respectively. The outputs of the miter circuits 300 may be represented by root 1 and root 2 respectively.

The Boolean Expression Diagram 350 representation may not be canonical but is polynomial in size of the original circuit. H. Hulgaard et al., "Equivalence Checking of Combinational Circuits Using Boolean Expression Diagrams", IEEE Transactions on Computer Aided Design of Integrated Circuits and Systems, July 1999 provides a detailed description of constructing a Boolean Expression Diagram, and is hereby incorporated by reference in its entirety.

The Boolean Expression Diagram 350 may have several advantages. For example, in one embodiment, the Boolean Expression Diagram 350 may provide for efficient hashing to simplify and speedup identification of structurally isomorphic parts of the plurality of logic circuits. Furthermore, the Boolean Expression Diagram 350 may avoid creating individual OBDDs for logic circuits f 302 and g 304, and may enable construction of an OBDD of a reduced Boolean Expression Diagram of the miter circuit 300 directly.

Figure 4A:
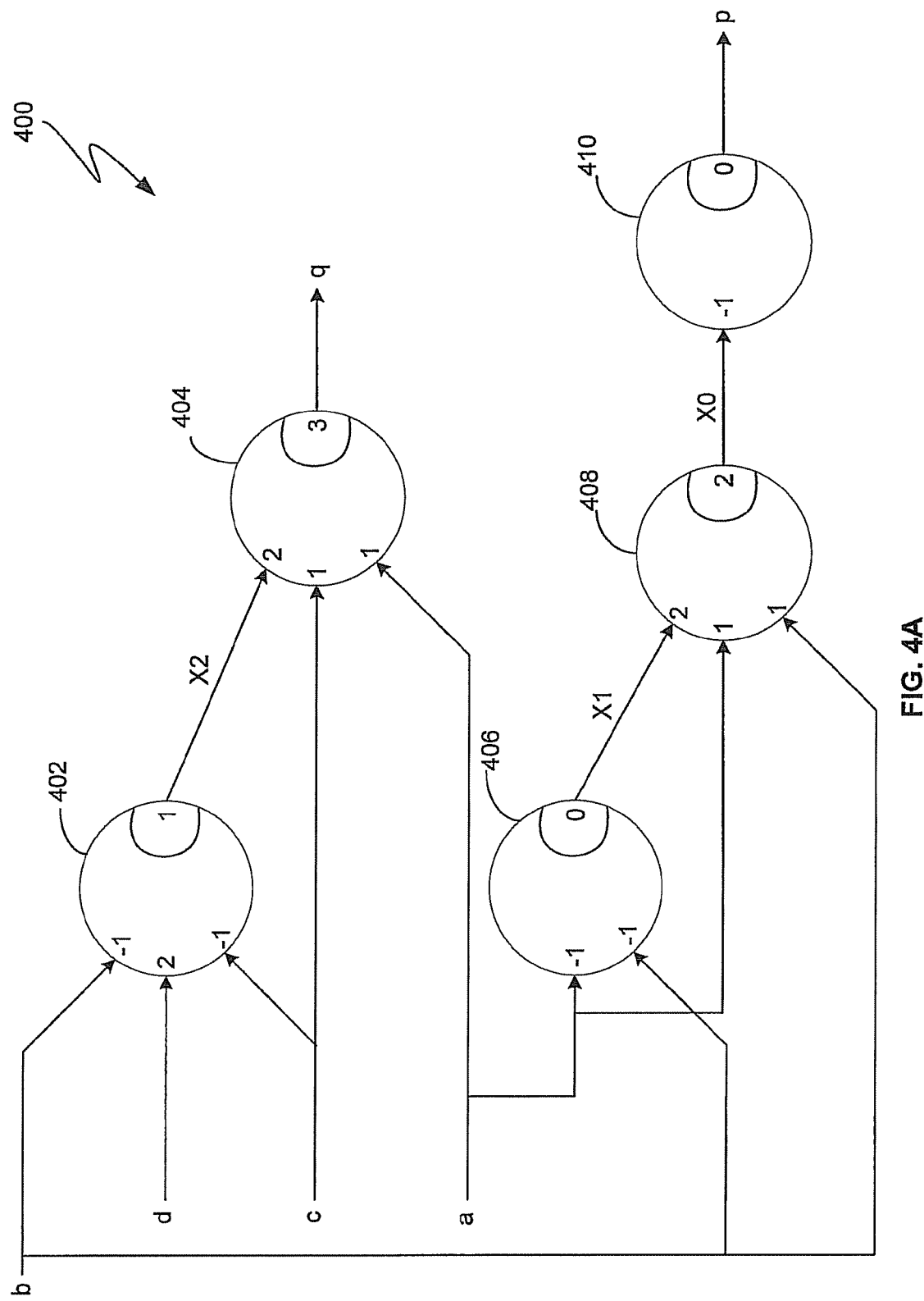
FIG. 4A is a diagram illustrating an exemplary threshold logic circuit, in accordance with an embodiment of the invention.

FIG. 4A is a diagram illustrating an exemplary threshold logic circuit, in accordance with an embodiment of the invention. Referring to FIG. 4A, there is shown a threshold logic circuit 400. The threshold logic circuit 400 may be generated based on Boolean function inputs p-Bool=(a+b)(a'+b') and q-Bool=d(ab'+ac'+b'c) by utilizing one or more synthesis tools. The threshold logic circuit 400 may comprise a plurality of threshold logic gates 402, 404, 406, 408 and 410. The threshold logic circuit 400 may receive as binary inputs, a, b, c, and d, and generate as outputs, p-Th and q-Th.

The threshold logic gate 402 may comprise suitable logic and/or circuitry to implement a threshold function Th1=[W; T], where W is a set of input weights, W=(−1, 2, −1), T=1 is a threshold value of the threshold logic gate 402, and X is a set of 3 binary inputs to the threshold logic gate 402, X={b, d, c}. The one or more circuits in the computer system 110 may be operable to generate a Boolean function representation of the threshold logic gate 402 based on the method 160 described in FIG. 1D. For example, the one or more circuits in the computer system 110 may be operable to recursively decompose the threshold function Th1 into a first function $F_1$ and a second function $F_2$ using cofactors of the threshold function F. The one or more circuits in the computer system 110 may be operable to generate a Boolean function representation, X2, of the threshold logic gate 402 based on the recursive decomposition of the threshold function Th1 to be equivalent to d(b'+c'). The generated Boolean function representation of the threshold logic gate 402, d(b'+c') is a maximally factored form representation of a minimal sum of products (SOP) for the threshold logic gate 402.

The threshold logic gate 404 may comprise suitable logic and/or circuitry to implement a threshold function Th2=[W; T], where W is a set of input weights, W=(2, 1, 1), T=3 is a threshold value of the threshold logic gate 404, and X is a set of 3 binary inputs to the threshold logic gate 404, X={X2, c, a}. The one or more circuits in the computer system 110 may be operable to generate a Boolean function representation of the threshold logic gate 404 based on the method 160 described in FIG. 1D. For example, the one or more circuits in the computer system 110 may be operable to recursively decompose the threshold function Th2 into a first function $F_1$ and a second function $F_2$ using cofactors of the threshold function F. The one or more circuits in the computer system 110 may be operable to generate a Boolean function representation, q-Th, of the threshold logic gate 404 based on the recursive decomposition of the threshold function Th2 to be equivalent to X2(c+a). The generated Boolean function representation of the threshold logic gate 404, X2(c+a) is a maximally factored form representation of a minimal sum of products (SOP) for the threshold logic gate 404.

The threshold logic gate 406 may comprise suitable logic and/or circuitry to implement a threshold function Th3=[W; T], where W is a set of input weights, W=(−1, 1), T=0 is a threshold value of the threshold logic gate 406, and X is a set of 2 binary inputs to the threshold logic gate 406, X={a, b}. The one or more circuits in the computer system 110 may be operable to generate a Boolean function representation of the threshold logic gate 406 based on the method 160 described in FIG. 1D. For example, the one or more circuits in the computer system 110 may be operable to recursively decompose the threshold function Th3 into a first function $F_1$ and a second function $F_2$ using cofactors of the threshold function F. The one or more circuits in the computer system 110 may be operable to generate a Boolean function representation, X1, of the threshold logic gate 406 based on the recursive decomposition of the threshold function Th3 to be equivalent to a'b'. The generated Boolean function representation of the threshold logic gate 406, a'b' is a maximally factored form representation of a minimal sum of products (SOP) for the threshold logic gate 406.

The threshold logic gate 408 may comprise suitable logic and/or circuitry to implement a threshold function Th4=[W; T], where W is a set of input weights, W=(2, 1, 1), T=2 is a threshold value of the threshold logic gate 408, and X is a set of 3 binary inputs to the threshold logic gate 406, X={X1, a, b}. The one or more circuits in the computer system 110 may be operable to generate a Boolean function representation of the threshold logic gate 408 based on the method 160 described in FIG. 1D. For example, the one or more circuits in the computer system 110 may be operable to recursively decompose the threshold function Th4 into a first function $F_1$ and a second function $F_2$ using cofactors of the threshold function F. The one or more circuits in the computer system 110 may be operable to generate a Boolean function representation, X0, of the threshold logic gate 408 based on the recursive decomposition of the threshold function Th4 to be equivalent to X1+ab. The generated Boolean function representation of the threshold logic gate 408, X1+ab is a maximally factored form representation of a minimal sum of products (SOP) for the threshold logic gate 408.

The threshold logic gate 410 may comprise suitable logic and/or circuitry to implement a threshold function Th5=[W; T], where W is a weight, W=(−1), T=0 is a threshold value of the threshold logic gate 410, and X is a single binary input to the threshold logic gate 410, X={X0}. The one or more circuits in the computer system 110 may be operable to generate a Boolean function representation of the threshold logic gate 410 based on the method 160 described in FIG. 1D. For example, the one or more circuits in the computer system 110 may be operable to generate the Boolean function representation of the threshold logic gate 410, p-Th, to be equivalent to an inverse of the binary input X0, (X0'), since the weight −1 is lesser than the threshold value zero (0) and the threshold value zero (0) is equal to zero (0). The generated Boolean function representation of the threshold logic gate 406, X0' is a maximally factored form representation of a minimal sum of products (SOP) for the threshold logic gate 410. Notwithstanding, the invention may not be so limited and other functions may be utilized to generate other threshold logic circuits, without limiting the scope of the invention.

In accordance with an embodiment of the invention, the miter circuit 300 may be constructed, wherein the logic circuit f 302 may receive as binary inputs a, b, c, and d, and generate as an output, q-Th, where q-Th=X2(c+a), where X2=d(b'+c'). Similarly, the logic circuit g 304 may receive as binary inputs a, b, c, and d, and generate as an output, q-Bool, where q-Bool=d(ab'+ac'+b'c). The miter circuit 300 may be operable to verify a logical equivalence of the logic circuits f 302 and g 304, and generate an output equivalent to one (1), if the logic circuit f 302 is equivalent to the logic circuit g 304.

In accordance with an embodiment of the invention, the miter circuit 300 may be constructed, wherein the logic circuit f 302 may receive as binary inputs a and b, and generate as an output, p-Th, where p-Th=X0', where X0=X1+ab, where X1=a'b'. Similarly, the logic circuit g 304 may receive as binary inputs a and b, and generate as an output, p-Bool, where p-Bool=(a+b)(a'+b'). The miter circuit 300 may be operable to verify a logical equivalence of the logic circuits f 302 and g 304, and generate an output equivalent to one (1), if the logic circuit f 302 is equivalent to the logic circuit g 304.

Figure 4B:
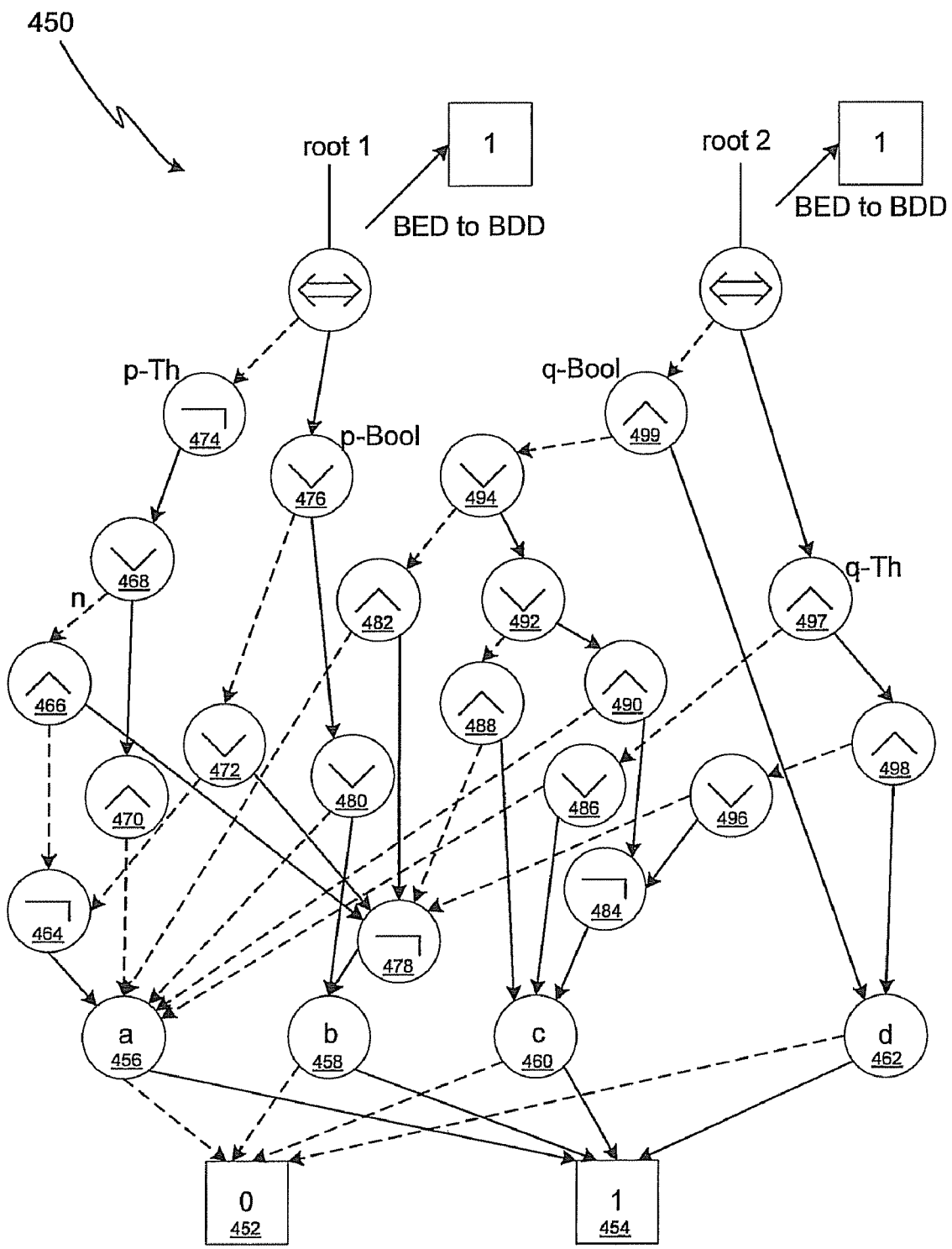
FIG. 4B is an exemplary Boolean Expression Diagram of a miter of the threshold logic circuits illustrated in FIG. 4A, in accordance with an embodiment of the invention.

FIG. 4B is an exemplary Boolean Expression Diagram of a miter of the threshold logic circuits illustrated in FIG. 4A, in accordance with an embodiment of the invention. Referring to FIG. 4B, there is shown a Boolean Expression Diagram 450. The one or more circuits in the computer system 110 may be operable to generate the Boolean Expression Diagram 450 based on the miter circuit constructed based on the outputs of the logic circuit 400, p-Th and q-Th, and the Boolean functions p-Bool and q-Bool, for example. Notwithstanding, the invention may not be so limited, and the Boolean Expression Diagram 450 may be utilized to verify a logical equivalence of a threshold logic circuit and one or more other logic circuits, without limiting the scope of the invention.

With reference to FIG. 4B, each logic gate in the threshold logic function 400, the Boolean functions p-Bool and q-Bool, and the miter circuit 300 may be replaced by an equivalent operator node, for example, operator nodes 464, 466, 468, 470, 472, 474, 476, 478, 480, 482, 484, 486, 488, 490, 492, 494, 496, 497, 498 and 499, and each binary input (a, b, c and d) may be replaced by a corresponding variable node 456, 458, 460, and 462 respectively. The variable nodes 456, 458, 460, and 462 may be connected to the two terminal nodes 452 (0) and 454 (1) respectively. The outputs (p-Th, p-Bool, q-Th, and q-Bool) may be represented by the binary inputs to the variable nodes 474, 476, 497 and 499 respectively. The outputs of the miter circuits 300 may be represented by root 1 and root 2 respectively.

In accordance with an embodiment of the invention, the one or more circuits in the computer system 110 may be operable to generate the Boolean function representations of one or more other logic circuits, for example, p-Bool and q-Bool. The one or more circuits in the computer system 110 may be operable to generate one or more Boolean Expression Diagrams, for example, Boolean Expression Diagram 450 for each of the generated Boolean function representations, p-Bool, q-Bool, p-Th and q-Th. The generated Boolean Expression Diagram 450 may be reduced to a binary decision diagram (BDD) and further to the constant one (1). Accordingly, the one or more circuits in the computer system 110 may be operable to verify the logical equivalence of the threshold logic circuit 400, p-Th and q-Th, with the Boolean function representation, p-Bool and q-Bool based on the generated Boolean Expression Diagram 450. Notwithstanding, the invention may not be so limited, and other tools and/or logic graphs may be utilized to verify a logical equivalence of a plurality of circuits, without limiting the scope of the invention.

Figure 5:
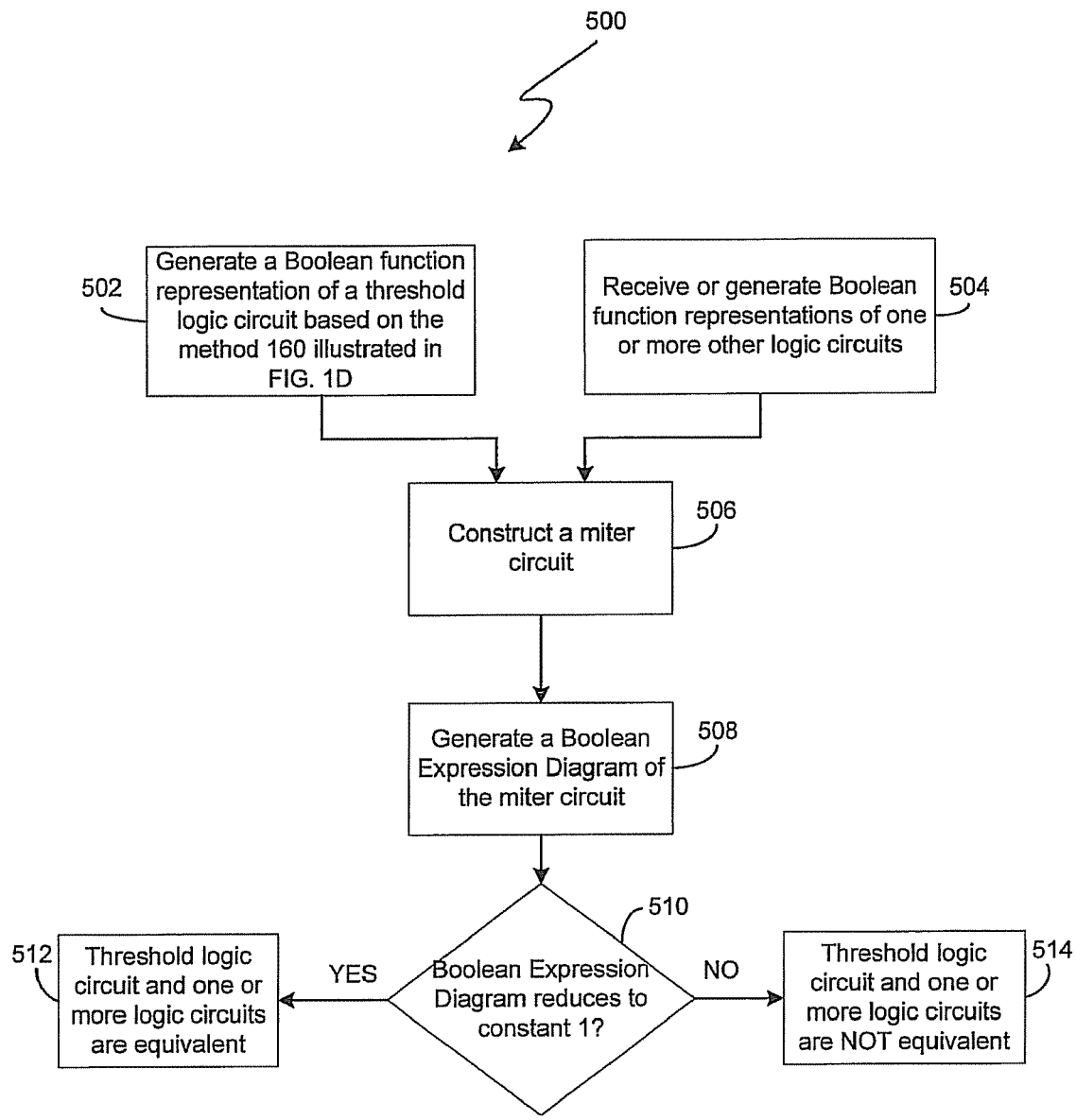
FIG. 5 is a flowchart illustrating exemplary steps for combinational equivalence checking of threshold logic circuits, in accordance with an embodiment of the invention.

FIG. 5 is a flowchart illustrating exemplary steps for combinational equivalence checking of threshold logic circuits, in accordance with an embodiment of the invention. Referring to FIG. 5, there is shown a method 500 comprising a plurality of exemplary steps. In step 502, the one or more circuits in the computer system 110 may be operable to generate a Boolean function representation of a threshold logic circuit based on the method 160 as illustrated in FIG. 1D and as described in the corresponding paragraphs of the specification. In step 504, the Boolean function representations of one or more other logic circuits may be received or generated, for example, by applying the method 160 to the one or more other logic circuits. Notwithstanding, the invention may not be so limited, and other methods may be utilized to generate the Boolean function representations of the one or more other logic circuits, without limiting the scope of the invention.

In step 506, a miter circuit may be constructed, that receives as binary inputs, the outputs generated by steps 502 and 504, and generates an output. In step 508, one or more Boolean Expression Diagrams may be generated for the miter circuit of the generated Boolean function representations from steps 502 and 504. In step 510, it may be determined whether the generated one or more Boolean Expression Diagrams reduce to a constant one (1). If the generated one or more Boolean Expression Diagrams reduce to a constant one (1), control passes to step 512. In step 512, the threshold logic circuit is equivalent to the one or more other logic circuits. If the generated one or more Boolean Expression Diagrams does not reduce to a constant one (1), control passes to step 514. In step 514, the threshold logic circuit is not equivalent to the one or more other logic circuits.

In accordance with an embodiment of the invention, a computer system for verifying a logical equivalence of a plurality of circuits may comprise one or more circuits for use in the computer system 110. The one or more circuits in the computer system 110 may be operable to receive one or more inputs, for example, weighted binary inputs ($w_1x_1$, $w_2x_2$, ..., $w_nx_n$) at the threshold logic gate 100. Notwithstanding, the invention may not be so limited, and the one or more inputs may comprise one or more of binary inputs, weights, and/or weighted binary inputs, without limiting the scope of the invention. The one or more circuits in the computer system 110 may implement a threshold function F=[W; T] of the threshold logic gate 100, where W is a set of input weights, W=($w_1, w_2, ..., w_n$), X is a set of n binary inputs to the threshold logic gate 100, X={$x_1, x_2, ..., x_n$}, and T is a threshold value of the threshold logic gate 100.

In accordance with an embodiment of the invention, the threshold logic gate 100 may comprise one binary input $x_1$ with a corresponding weight $w_1$. The one or more circuits in the computer system 110 may be operable to generate the Boolean function representation of the threshold logic gate 100 to be equivalent to one (1), if the weight $w_1$ is greater than or equal to the threshold value T and the threshold value T is lesser than or equal to zero (0). The one or more circuits in the computer system 110 may be operable to generate the Boolean function representation of the threshold logic gate 100 to be equivalent to the binary input $x_1$, if the weight $w_1$ is greater than or equal to the threshold value T and the threshold value T is greater than zero (0). The one or more circuits in the computer system 110 may be operable to generate the Boolean function representation of the threshold logic gate 100 to be equivalent to an inverse of the binary input $x_1$ ($x_1$'), if the weight $w_1$ is lesser than the threshold value T and the threshold value T is lesser than or equal to zero (0). The one or more circuits in the computer system 110 may be operable to generate the Boolean function representation of the threshold logic gate 100 to be equivalent to zero (0), if the weight $w_1$ is lesser than the threshold value T and the threshold value T is greater than zero (0).

In accordance with an embodiment of the invention, if the threshold logic gate 100 may comprise more than one binary input, the one or more circuits in the computer system 110 may be operable to determine whether a sum of negative weights is greater than or equal to the threshold value T. The one or more circuits in the computer system 110 may be operable to generate the Boolean function representation of the threshold logic gate to be equivalent to one (1), if the sum of the negative weights is greater than or equal to the threshold value T according to equation (3). The one or more circuits in the computer system 110 may be operable to determine whether a sum of positive weights is lesser than the threshold value T. The one or more circuits in the computer system 110 may be operable to generate the Boolean function representation of the threshold logic gate to be equivalent to zero (0), if the sum of the positive weights is lesser than the threshold value T according to equation (4).

The one or more circuits in the computer system 110 may be operable to recursively decompose the threshold function F into a first function $F_1$ and a second function $F_2$ using cofactors of the threshold function F. The one or more circuits in the computer system 110 may be operable to generate a Boolean function representation of the threshold logic gate 100 based on the recursive decomposition of the threshold function F. The generated Boolean function representation of the threshold logic gate 100 may be a maximally factored form representation of a minimal sum of products (SOP) for the threshold logic gate 100.

The first function $F_1$ may be generated, for example, by recursively decomposing the threshold function F into [W\\$w_k$; T−$w_k$], where $w_k$ is a largest absolute weight and W\\$w_k$=($w_1,w_2, ..., w_{k-1}, w_{k+1}, ..., w_n$) is a set of weights excluding $w_k$. The second function $F_2$ may be generated, for example, by recursively decomposing the threshold function F into [W\\$w_k$; T], where $w_k$ is a largest absolute weight and W\\$w_k$=($w_1,w_2, ..., w_{k-1}, w_{k+1}, ..., w_n$) is a set of weights excluding $w_k$.

The one or more circuits in the computer system 110 may be operable to generate the Boolean function representation of the threshold logic gate 100 to be equivalent to [$x_k \cdot F_1 + F_2$], if $w_k$ is greater than zero (0), where $x_k$ is the binary input to the threshold logic gate 100 corresponding to the largest absolute weight $w_k$. The one or more circuits in the computer system 110 may be operable to generate the Boolean function representation of the threshold logic gate 100 to be equivalent to [$F_1 + x_k' \cdot F_2$], if $w_k$ is lesser than zero (0), where $w_k$' is the inverse of the binary input $x_k$ to the threshold logic gate 100 corresponding to the largest absolute weight $w_k$.

In accordance with another embodiment of the invention, a threshold logic circuit, for example, 400 may comprise one or more of the threshold logic gates, for example, 402, 404, 406, 408 and 410 and/or one or more Boolean logic circuits, for example, p-Bool and q-Bool. The one or more circuits in the computer system 110 may be operable to generate the Boolean function representation of the one or more threshold logic gates, for example, 402, 404, 406, 408 and 410. The one or more circuits in the computer system 110 may be operable to verify the logical equivalence of the threshold logic circuit, for example, 400 with the one or more other logic circuits, for example, p-Bool and q-Bool based on the generated Boolean function representation of the one or more threshold logic gates, for example, 402, 404, 406, 408 and 410.

In accordance with another embodiment of the invention, the one or more circuits in the computer system 110 may be operable to generate the Boolean function representations of one or more other logic circuits, for example, p-Bool and q-Bool. The one or more circuits in the computer system 110 may be operable to generate one or more Boolean Expression Diagrams, for example, 450 based on the generated Boolean function representations, for example, p-Th, q-Th, p-Bool and q-Bool. The one or more circuits in the computer system 110 may be operable to verify the logical equivalence of the threshold logic gate 100, for example, p-Th and q-Th with the one or more other logic circuits, for example, p-Bool and q-Bool based on the generated Boolean Expression Diagrams, for example, 450.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for combinational equivalence checking for threshold logic circuits.

Accordingly, the present invention may be realized in hardware, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for verifying a logical equivalence of a plurality of circuits, the method comprising:
   receiving one or more inputs at a threshold logic gate implementing a threshold function $F=[W;T]$, where W is a set of input weights, $W=(w_1, w_2, \ldots, w_n)$, X is a set of n binary inputs to said threshold logic gate, $X=\{x_1, x_2, \ldots, x_n\}$, and T is a threshold value of said threshold logic gate;
   recursively decomposing said threshold function F into a first function $F_1$ and a second function $F_2$ using cofactors of said threshold function F;
   generating a Boolean function representation of said threshold logic gate based on said recursive decomposition of said threshold function F; and
   verifying said logical equivalence of said threshold logic gate with one or more other logic circuits based on said generated Boolean function representation of said threshold logic gate, wherein said method is executed by one or more circuits in a computer.

2. The method according to claim 1, wherein said first function $F_1$ is generated by recursively decomposing said threshold function F into $[W\backslash w_k; T-w_k]$, where $w_k$ is a largest absolute weight and $W\backslash w_k=(w_1, w_2, \ldots, w_{k-1}, w_{k+1}, \ldots, w_n)$ is a set of weights excluding $w_k$.

3. The method according to claim 2, wherein said second function $F_2$ is generated by recursively decomposing said threshold function F into $[W\backslash w_k; T]$, where $w_k$ is a largest absolute weight and $W\backslash w_k=(w_1, w_2, \ldots, w_{k-1}, w_{k+1}, \ldots, w_n)$ is a set of weights excluding $w_k$.

4. The method according to claim 3, wherein generating said Boolean function representation of said threshold logic gate comprises generating the Boolean function representation of said threshold logic gate to be equivalent to $[x_k \cdot F_1 + F_2]$, if $w_k$ is greater than zero (0), where $x_k$ is said binary input to said threshold logic gate corresponding to said largest absolute weight $w_k$.

5. The method according to claim 3, wherein generating said Boolean function representation of said threshold logic gate comprises generating the Boolean function representation of said threshold logic gate to be equivalent to $[F_1 + x_k' \cdot F_2]$, if $w_k$ is lesser than zero (0), where $x_k'$ is an inverse of said binary input $x_k$ to said threshold logic gate corresponding to said largest absolute weight $w_k$.

6. The method according to claim 1, comprising:
   determining whether a sum of negative weights is greater than or equal to said threshold value T; and
   determining whether a sum of positive weights is lesser than said threshold value T.

7. The method according to claim 6, wherein generating said Boolean function representation of said threshold logic gate comprises generating the Boolean function representation of said threshold logic gate to be equivalent to one (1), if said sum of said negative weights is greater than or equal to said threshold value T.

8. The method according to claim 6, wherein generating said Boolean function representation of said threshold logic gate comprises generating the Boolean function representation of said threshold logic gate to be equivalent to zero (0), if said sum of said positive weights is lesser than said threshold value T.

9. The method according to claim 1, wherein said threshold logic gate comprises one binary input $x_1$ with a corresponding weight $W_1$.

10. The method according to claim 9, comprising generating said Boolean function representation of said threshold logic gate to be equivalent to one (1), if said weight $w_1$ is greater than or equal to said threshold value T and said threshold value T is lesser than or equal to zero (0).

11. The method according to claim 9, comprising generating said Boolean function representation of said threshold logic gate to be equivalent to said binary input $x_1$, if said weight $w_1$ is greater than or equal to said threshold value T and said threshold value T is greater than zero (0).

12. The method according to claim 9, comprising generating said Boolean function representation of said threshold logic gate to be equivalent to an inverse of said binary input $x_1$ ($x_1'$), if said weight $w_1$ is lesser than said threshold value T and said threshold value T is lesser than or equal to zero (0).

13. The method according to claim 9, comprising generating said Boolean function representation of said threshold logic gate to be equivalent to zero (0), if said weight $w_1$ is lesser than said threshold value T and said threshold value T is greater than zero (0).

14. The method according to claim 1, wherein a threshold logic circuit comprises one or more of said threshold logic gates and/or one or more Boolean logic circuits.

15. The method according to claim 14, comprising:
generating said Boolean function representation of said one or more threshold logic gates; and
verifying said logical equivalence of said threshold logic circuit with said one or more other logic circuits based on said generated Boolean function representation of said one or more threshold logic gates.

16. The method according to claim 1, wherein said generated Boolean function representation of said threshold logic gate is a maximally factored form representation of a minimal sum of products (SOP) for said threshold logic gate.

17. The method according to claim 1, comprising:
generating said Boolean function representations of said one or more other logic circuits;
generating one or more Boolean Expression Diagrams based on said generated Boolean function representations; and
verifying said logical equivalence of said threshold logic gate with said one or more other logic circuits based on said generated one or more Boolean Expression Diagrams.

18. A computer system for verifying a logical equivalence of a plurality of circuits, the computer system comprising:
one or more circuits that is operable to receive one or more inputs at a threshold logic gate implementing a threshold function $F=[W;T]$, where W is a set of input weights, $W=(w_1, w_2, \ldots, w_n)$, X is a set of n binary inputs to said threshold logic gate, $X=\{x_1, x_2, \ldots, x_n\}$, and T is a threshold value of said threshold logic gate;
said one or more circuits is operable to recursively decompose said threshold function F into a first function $F_1$ and a second function $F_2$ using cofactors of said threshold function F;
said one or more circuits is operable to generate a Boolean function representation of said threshold logic gate based on said recursive decomposition of said threshold function F; and
said one or more circuits is operable to verify a logical equivalence of said threshold logic gate with one or more other logic circuits based on said generated Boolean function representation of said threshold logic gate.

19. The computer system according to claim 18, wherein said first function $F_1$ is generated by recursively decomposing said threshold function F into $[W\backslash W_k; T-W_k]$, where $w_k$ is a largest absolute weight and $W\backslash W_k=(w_1, w_2, \ldots, W_{k-1}, w_{k+1}, \ldots, w_n)$ is a set of weights excluding $W_k$.

20. The computer system according to claim 19, wherein said second function $F_2$ is generated by recursively decomposing said threshold function F into $[W\backslash W_k; T]$, where $w_k$ is a largest absolute weight and $W\backslash W_k=(w_1, w_2, \ldots, w_{k-1}, w_{k+1}, \ldots, w_n)$ is a set of weights excluding $w_k$.

21. The computer system according to claim 20, wherein said one or more circuits is operable to generate said Boolean function representation of said threshold logic gate to be equivalent to $[x_k \cdot F_1 + F_2]$, if $w_k$ is greater than zero (0), where $x_k$ is said binary input to said threshold logic gate corresponding to said largest absolute weight $w_k$.

22. The computer system according to claim 20, wherein said one or more circuits is operable to generate said Boolean function representation of said threshold logic gate to be equivalent to $[F_1+x_k' \cdot F_2]$, if $w_k$ is lesser than zero (0), where $x_k'$ is an inverse of said binary input $x_k$ to said threshold logic gate corresponding to said largest absolute weight $w_k$.

23. The computer system according to claim 18, wherein:
said one or more circuits is operable to determine whether a sum of negative weights is greater than or equal to said threshold value T; and
said one or more circuits is operable to determine whether a sum of positive weights is lesser than said threshold value T.

24. The computer system according to claim 23, wherein said one or more circuits is operable to generate said Boolean function representation of said threshold logic gate to be equivalent to one (1), if said sum of said negative weights is greater than or equal to said threshold value T.

25. The computer system according to claim 23, wherein said one or more circuits is operable to generate said Boolean function representation of said threshold logic gate to be equivalent to zero (0), if said sum of said positive weights is lesser than said threshold value T.

26. The computer system according to claim 18, wherein said threshold logic gate comprises one binary input $x_1$ with a corresponding weight $w_1$.

27. The computer system according to claim 26, wherein said one or more circuits is operable to generate said Boolean function representation of said threshold logic gate to be equivalent to one (1), if said weight $w_1$ is greater than or equal to said threshold value T and said threshold value T is lesser than or equal to zero (0).

28. The computer system according to claim 26, wherein said one or more circuits is operable to generate said Boolean function representation of said threshold logic gate to be equivalent to said binary input $x_1$, if said weight $w_1$ is greater than or equal to said threshold value T and said threshold value T is greater than zero (0).

29. The computer system according to claim 26, wherein said one or more circuits is operable to generate said Boolean function representation of said threshold logic gate to be equivalent to an inverse of said binary input $x_1$ ($x_1'$), if said weight $w_1$ is lesser than said threshold value T and said threshold value T is lesser than or equal to zero (0).

30. The computer system according to claim 26, wherein said one or more circuits is operable to generate said Boolean function representation of said threshold logic gate to be equivalent to zero (0), if said weight $w_1$ is lesser than said threshold value T and said threshold value T is greater than zero (0).

31. The computer system according to claim 18, wherein a threshold logic circuit comprises one or more of said threshold logic gates and/or one or more Boolean logic circuits.

32. The computer system according to claim 31, wherein:
said one or more circuits is operable to generate said Boolean function representation of said one or more threshold logic gates; and
said one or more circuits is operable to verify said logical equivalence of said threshold logic circuit with said one or more other logic circuits based on said generated Boolean function representation of said one or more threshold logic gates.

33. The computer system according to claim 18, wherein said generated Boolean function representation of said threshold logic gate is a maximally factored form representation of a minimal sum of products (SOP) for said threshold logic gate.

34. The computer system according to claim 18, wherein:
said one or more circuits is operable to generate said Boolean function representations of said one or more other of said threshold logic gates;
said one or more circuits is operable to generate one or more Boolean Expression Diagrams based on said generated Boolean function representations; and
said one or more circuits is operable to verify said logical equivalence of said threshold logic gate with said one or more other of said threshold logic circuits based on said generated one or more Boolean Expression Diagrams.

35. A non-transitory computer readable medium having stored thereon, a computer program having at least one code section for verifying a logical equivalence of a plurality of circuits, the at least one code section being executable by a computer system for causing the computer system to perform steps comprising:

receiving one or more inputs at a threshold logic gate implementing a threshold function $F=[W;T]$, where W is a set of input weights, $W=(w_1, w_2, \ldots, w_n)$, X is a set of n binary inputs to said threshold logic gate, $X=\{x_1, x_2, \ldots, x_n\}$, and T is a threshold value of said threshold logic gate;

recursively decomposing said threshold function F into a first function $F_1$ and a second function $F_2$ using cofactors of said threshold function F;

generating a Boolean function representation of said threshold logic gate based on said recursive decomposition of said threshold function F; and verifying a logical equivalence of said threshold logic gate with one or more other logic circuits based on said generated Boolean function representation of said threshold logic gate.

* * * * *